(12) United States Patent
Hertz et al.

(10) Patent No.: US 9,851,404 B2
(45) Date of Patent: Dec. 26, 2017

(54) SWITCHGEAR FOR A SINGLE-PHASE MOTOR AND A THREE-PHASE MOTOR

(71) Applicant: Siemens Aktiengesellschaft, Munich (DE)

(72) Inventors: Dirk Hertz, Fichtenhof (DE); Marco Schönenberg, Kuemmersbruck (DE); Helene Steuer, Nuremberg (DE); Stefan Zitzler, Schwandorf (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 230 days.

(21) Appl. No.: 14/423,903

(22) PCT Filed: Aug. 20, 2013

(86) PCT No.: PCT/EP2013/067273
§ 371 (c)(1),
(2) Date: Feb. 25, 2015

(87) PCT Pub. No.: WO2014/033006
PCT Pub. Date: Mar. 6, 2014

(65) Prior Publication Data
US 2015/0241514 A1    Aug. 27, 2015

(30) Foreign Application Priority Data

Aug. 27, 2012 (DE) .................. 10 2012 215 166

(51) Int. Cl.
*G01R 31/327* (2006.01)
*H02H 3/34* (2006.01)
(Continued)

(52) U.S. Cl.
CPC ......... *G01R 31/3277* (2013.01); *G01R 29/16* (2013.01); *H02B 1/20* (2013.01);
(Continued)

(58) Field of Classification Search
CPC combination set(s) only.
See application file for complete search history.

(56) References Cited

U.S. PATENT DOCUMENTS

| | | |
|---|---|---|
| 4,628,395 A | 12/1986 | Sugishima |
| 5,294,879 A | 3/1994 | Freeman et al. |

(Continued)

FOREIGN PATENT DOCUMENTS

| | | |
|---|---|---|
| CN | 201130850 Y | 10/2008 |
| DE | 3442607 A1 | 6/1985 |
| JP | 2005227073 A | 8/2005 |

*Primary Examiner* — Minh Phan
(74) *Attorney, Agent, or Firm* — Harness, Dickey & Pierce (57) ABSTRACT

An embodiment relates to a switchgear for a single-phase motor and a three-phase motor, the switchgear including a processing unit and a first, second and third current path, the first and third current path each including a current transformer. The processing unit is adapted to detect the current $I_1$ of the first current path and the current $I_3$ of the third current path. To provide a cost-effective switchgear for a one-phase motor and a three-phase motor which is adapted to identify the failure of every single phase in the three-phase operation and a phase failure in the one-phase operation, the processing unit is designed such as to detect the currents $I_1$, $I_3$ of the first and third current path and to determine, based on the phase shift between the detected currents $I_1$, $I_3$ of the first and third current path in which operating mode the switchgear is operated.

25 Claims, 1 Drawing Sheet

(51) Int. Cl.
*H02P 25/04* (2006.01)
*G01R 29/16* (2006.01)
*H02H 7/09* (2006.01)
*H02H 3/32* (2006.01)
*H02B 1/20* (2006.01)
*H02P 25/16* (2006.01)
*H02J 3/26* (2006.01)
*G01R 31/42* (2006.01)

(52) U.S. Cl.
CPC ............ *H02H 3/32* (2013.01); *H02H 3/34* (2013.01); *H02H 3/343* (2013.01); *H02H 7/09* (2013.01); *H02P 25/04* (2013.01); *H02P 25/16* (2013.01); *G01R 31/42* (2013.01); *H02J 3/26* (2013.01); *Y02E 40/50* (2013.01); *Y02P 80/14* (2015.11); *Y02P 80/152* (2015.11)

(56) References Cited

U.S. PATENT DOCUMENTS

| | | | |
|---|---|---|---|
| 5,896,257 A | 4/1999 | Takahashi | |
| 2012/0056613 A1 | 3/2012 | Hawel et al. | |
| 2015/0377939 A1* | 12/2015 | Ishihara | G01R 29/18 324/107 |

* cited by examiner

SWITCHGEAR FOR A SINGLE-PHASE MOTOR AND A THREE-PHASE MOTOR

PRIORITY STATEMENT

This application is the national phase under 35 U.S.C. §371 of PCT International Application No. PCT/EP2013/067273 which has an International filing date of Aug. 20, 2013, which designated the United States of America, and which claims priority to German application number DE 102012215166.4 filed on Aug. 27, 2012, the entire contents of each of which are hereby incorporated herein by reference.

FIELD

At least one embodiment of the invention generally relates to a switchgear, both a single-phase motor and a three-phase motor being able to be controlled thereby, and/or a method of the switchgear.

BACKGROUND

In the field of industrial automation technology, electrical loads (for example an electric motor) are connected to a power supply network for the supply of power. The power supply network is, in particular, a low voltage network.

In the voltages generally used in low voltage networks in Europe, the nominal value of the star voltage is 230 volts. For controlling an electrical load, the power supply to the electrical load is conducted via a switchgear so that the load is able to be controlled thereby. The switchgear is thus connected on the input side to the power supply network and is connected on the output side to the electrical load. In the case of electric motors, such switchgears are generally motor starters.

If the power supply network is a three-phase alternating current network and the consumer is a three-phase motor, a three-phase alternating current is applied to the consumer. The three-phase alternating current is conducted to the consumer via the switchgear, in particular via the three current paths thereof, so that the switchgear operates in three-phase operation. In standard operation, with three-phase alternating current, three separate alternating currents and/or alternating voltages of the same frequency are present and have a fixed phase shift of 120° relative to one another. An alternating current is an electrical current which alters its direction (polarity) in regular repetition and in which positive and negative instantaneous values complement one another so that the current in the temporal mean is zero.

If the consumer is a single-phase motor, one phase of the three-phase alternating current network is generally conducted to the single-phase motor via the individual current paths of the switchgear. The switchgear operates in single-phase operation.

In electronic switchgears for motorized and non-motorized loads, it is advantageous to identify different network errors, such as phase failure, phase overload and phase unbalance in order to switch off the load in this case and to communicate the error to the operator. Such errors may be the absence of individual phases, a plurality of phases or all three phases. The identification of interruptions to individual motor conductors or a plurality of motor conductors is also incorporated therein.

To determine such network errors, unbalances and cases of overload, voltage values and current values of the individual phases are generally detected and evaluated by the interposed switchgear.

SUMMARY

At least one embodiment of the present invention provides a cost-effective switchgear for a single-phase motor and a three-phase motor, the switchgear being able to identify the failure of each individual phase in three-phase operation and being able to identify a phase failure in single-phase operation. In at least one embodiment, the switchgear also permits the identification of a phase overload relative to the connected phases, both for three-phase operation and for single-phase operation. In at least one embodiment, the switchgear preferably also identifies a phase unbalance and/or in three-phase operation the failure of any two phases and/or the failure of all three phases.

At least one embodiment is directed to a device, i.e. a switchgear for a single-phase motor and a three-phase motor, wherein the switchgear comprises a processing unit and a first, second and third current path, wherein the first and third current paths in each case comprise a current transformer, wherein the processing unit is able to detect, via the current transformers, the current $I_1$ of the first current path and the current $I_3$ of the third current path, wherein the processing unit is configured such that it detects the currents $I_1$, $I_3$ of the first and third current paths and ascertains the present operating mode of the switchgear via the phase shift between the detected currents $I_1$, $I_3$ of the first and third current paths.

At least one embodiment is directed to a method, i.e. a method of a switchgear for a single-phase motor and a three-phase motor, wherein the switchgear comprises a processing unit and a first, second and third current path, wherein the first and third current paths in each case comprise a current transformer, wherein the processing unit is able to detect by way of the current transformers the current $I_1$ of the first current path and the current $I_3$ of the third current path, wherein for ascertaining a present operating mode of the switchgear the processing unit performs the following steps:

- detecting the currents $I_1$, $I_3$ of the first and third current paths,
- determining values characterizing the phase shift between the detected currents $I_1$, $I_3$ of the first and third current paths, using the detected currents $I_1$, $I_3$ of the first and third current paths,
- ascertaining the present operating mode of the switchgear by evaluating the determined values characterizing the phase shift between the detected currents $I_1$, $I_3$ of the first and third current paths.

Advantageous developments of the invention are set forth in the dependent claims.

BRIEF DESCRIPTION OF THE DRAWINGS

The invention and embodiments of the invention are described in more detail hereinafter and explained with reference to the exemplary embodiments shown in the figures, in which.

DETAILED DESCRIPTION OF THE EXAMPLE EMBODIMENTS

Either the power supply for a single-phase motor may be conducted via the switchgear so that a single-phase operation is present as the operating mode of the switchgear. In this case, for example, the first, second and third current paths for the power supply of the single-phase motor are arranged in series. Alternatively, the power supply for a three-phase motor may be conducted via the switchgear, so that a three-phase operation is present as the operating mode of the switchgear. In this case the first, second and third current paths are connected in each case to the three-phase motor and a phase of the power supply network.

The switchgear preferably does not comprise a current transformer in the second current path. Preferably, only the first and third current paths of the switchgear in each case comprise a current transformer. Preferably, the first and third current paths of the switchgear in each case have only one current transformer.

Preferably the power supply for the consumer connected downstream may be controlled by way of the switchgear. To this end, the switchgear preferably comprises a switch in at least two current paths. If the switchgear receives a start signal for starting the consumer connected downstream, for example from a master controller (for example a programmable controller), the switches are activated such that power is supplied to the consumer connected downstream via the switchgear. In a subsequent step, preferably the present operating mode is automatically ascertained by the switchgear.

For ascertaining the present operating mode, the current $I_1$, $I_3$ of the first and third current paths is initially detected by way of the current transformers within a time interval.

Subsequently, using the detected currents $I_1$, $I_3$ of the first and third current paths, the processing unit determines values which characterize the phase shift between the detected currents $I_1$, $I_3$ of the first and third current paths.

These determined characterizing values are then evaluated by the processing unit so that using this evaluation the present operating mode of the switchgear (single-phase operation or three-phase operation) is ascertained.

The operating mode is determined by the processing unit, therefore, by way of an evaluation of the values characterizing the phase shift between the detected currents $I_1$, $I_3$ of the first and third current paths. By way of these values it is possible for the processing unit to monitor whether the deduced phase shift between the detected currents $I_1$, $I_3$ of the first and third current paths (using the values characterizing the phase shift) is closer to the phase shift of three-phase operation or single-phase operation. In three-phase operation a phase shift of circa (alternatively referred to herein as "ca.," "approximately" or "substantially") 120° is present. In single-phase operation, a phase shift of ca. 0° or 180° is present.

When evaluating the determined values characterizing the phase shift, these values are preferably compared with a reference value so that conclusions may be drawn about the present phase shift between the detected currents, permitting an assignment to three-phase operation and/or single-phase operation. By way of the reference value, preferably a phase shift of 60° to 150° is defined as three-phase operation and a phase shift of 0° to 60° and 150° to 180° is defined as single-phase operation relative to the values characterizing the phase shift. The reference value may be stored securely in the processing unit. However, it is also conceivable that the reference value is formed using the detected currents of the first and third current paths. Similarly, it is conceivable that the reference value defines a plurality of threshold values, permitting an assignment to the respective operating mode of the switchgear.

The phase shift may be determined in various ways. The phase shift may, for example, take place by an evaluation of the zero crossings and/or maxima of the existing current of the first and third current paths. In this case, the zero crossings and/or maxima determined using the detected current $I_1$, $I_3$ of the first and third current paths would form the characterizing values. Using an evaluation of these values, in particular using an evaluation of the temporal offset of the zero crossings and/or maxima of the current of the two current paths to one another, the phase shift and thus the operating state of the switchgear may be ascertained.

Thus in the presence of an active power supply via the switchgear, the switchgear is able to ascertain automatically and independently whether a single-phase operation or a three-phase operation is present. By way of this information, a specific analysis relative to a phase failure, a phase overload and/or a phase unbalance of the connected phase(s) may be carried out.

If three-phase operation is identified, preferably the current $I_1$, $I_2$, $I_3$ of the first, second and third current paths is evaluated relative to the determination of a phase failure, a phase overload and/or a phase unbalance. The current of the second current path is in this case calculated using the detected current of the first and third current paths.

If single-phase operation is identified, only the current $I_1$, $I_3$ of the first and/or third current path is evaluated in terms of determining a phase failure and/or a phase overload.

If in single-phase operation the calculated current of the second current path were to be evaluated relative to the determination of the phase failure and/or the phase overload, this would lead to a faulty analysis. Such a faulty analysis may be avoided by a previously carried out determination of the operating mode on the switchgear.

In an advantageous embodiment of the invention, the processing unit is configured such that it repeatedly detects simultaneously the current $I_1$, $I_3$ of the first and third current paths within a time interval for ascertaining the present operating mode of the switchgear and in this case determines the first number of positively detected currents $I_1$, $I_3$ of the first or third current paths and the second number of simultaneously positively detected currents $I_1$, $I_3$ of the first and third current paths, and subsequently monitors whether the second number is greater than at least ca. 66% of the first number.

The term "simultaneous" detection of the current $I_1$, $I_3$ in the first and third current paths is understood as a virtually simultaneous detection of the currents $I_1$, $I_3$ in the two current paths.

Preferably, the processing unit also monitors whether the first number is greater than at least one, in particular greater than ca. ten. If a start signal has been implemented by the switchgear, so that power would have to be supplied to the consumer connected downstream, and the result of the monitoring is that within the considered time interval the first number is not greater than at least one, power is not supplied via the switchgear. An error is present, in particular a phase failure, which is preferably emitted as an error signal by the switchgear, for example to the master controller. If the result of the monitoring by the processing unit is that within the considered time interval the first number is greater than at least one, the present operating mode may also be determined by the processing unit.

If the result of the evaluation by the processing unit is that within the considered time interval the second number is greater than at least ca. 66%, in particular ca. 66% of the first number, a single-phase operation is present, i.e. power is supplied to a single-phase motor and/or only a single-phase load via the switchgear. The processing unit and thus the switchgear, therefore, identifies independently that a single-phase operation is present.

If the result of the evaluation is that within the considered time interval the second number is not greater than at least ca. 66%, in particular ca. 66% of the first number, a three-phase operation is present, i.e. power is supplied to a three-phase motor and/or three-phase load via the switchgear. The processing unit and the switchgear, therefore, identify independently that a three-phase operation is present.

Preferably, the time interval is at least one power supply network current period, in particular one power supply network current period. The time interval for repeated simultaneous determination of the currents $I_1$, $I_3$ is, in particular, securely stored in the switchgear. Preferably, the currents $I_1$, $I_3$ are simultaneously detected at least four times within the time interval. The currents are preferably detected at regular intervals. Preferably, the currents $I_1$, $I_3$ are simultaneously detected ca. every 500 μs within the time interval.

By counting the simultaneously positively detected currents $I_1$, $I_3$ of the first and third current paths, conclusions may be drawn relative to the phase shift between the current $I_1$, $I_3$ of the first and third current paths.

When counting the simultaneously positively detected currents $I_1$, $I_3$ of the first and third current paths and when counting the positively detected currents $I_1$, $I_3$ of the first or third current paths, the same current detections are considered within the time interval, in particular, in each case.

The simultaneously positively detected currents $I_1$, $I_3$ of the first and third current paths as well as the positively detected currents $I_1$, $I_3$ of the first or third current paths thus form the values characterizing the phase shift between the detected currents $I_1$, $I_3$ of the first and third current paths.

By comparing the second number with the first number, by which a reference value relative to the phase shift is formed, conclusions may be drawn about the present phase shift and thus conclusions obtained about the present operating mode.

It is also conceivable that the processing unit for ascertaining the present operating mode of the switchgear repeatedly detects simultaneously the current $I_1$, $I_3$ of the first and third current paths within the time interval and in this case determines the first number of negatively detected currents $I_1$, $I_3$ of the first or third current paths and the second number of simultaneously negatively detected currents $I_1$, $I_3$ of the first and third current paths and subsequently monitors whether the second number is greater than at least 66% of the first number. Moreover, it is possible for the processing unit to monitor whether the first number is greater than at least one.

If the result of the evaluation by the processing unit is that within the considered time interval the second number is greater than at least ca. 66%, in particular 66% of the first number, a single-phase operation is present. If the second number is not greater than at least ca. 66%, in particular ca. 66% of the first number, a three-phase operation is present. The processing unit and thus the switchgear independently identifies, therefore, the present operating state.

By way of an evaluation of the negatively detected currents of a current path with the simultaneously positively detected currents, or vice versa, conclusions may also be drawn about the present phase shift between the detected currents $I_1$, $I_3$ of the first and third current paths, so that the present operating mode may be ascertained.

In a further advantageous embodiment of the invention, the processing unit is configured such that, in three-phase operation of the switchgear, it calculates a value characterizing the current $I_2$ of the second current path for determining a phase failure of the phase which is conducted via the second current path, by simultaneously detected currents $I_1$, $I_3$ of the first and third current paths, and determines whether the calculated value corresponds to a characteristic phase failure current. The phase failure current is monitored, in particular, after determining the operating mode of the switchgear.

Initially, the currents $I_1$, $I_3$ of the first and third current paths are repeatedly detected simultaneously by the processing unit within a time interval and a value characterizing the current $I_2$ on the second current path is calculated therefrom. Preferably, the effective value of the current is calculated by the processing unit from the currents $I_1$, $I_3$ detected simultaneously within the time interval. After calculating the characterizing value, the processing unit may determine whether the calculated characterizing value (for example the effective value of the current $I_2$) corresponds to the characteristic phase failure current.

The time interval and/or the repetition of the simultaneous detection of the currents $I_1$, $I_3$ take place preferably in a similar manner to the determination of the operating mode.

If the result of the determination of the processing unit is that the calculated value corresponds to the characteristic phase failure current, a phase failure is present relative to the phase conducted via the second current path. The processing unit preferably emits a warning signal, in particular to the master controller, and/or prevents the power supply to the consumer connected downstream.

In a further advantageous embodiment of the invention, the processing unit is configured such that, in three-phase operation of the switchgear, for determining a phase failure of the phase which is conducted via the first current path, it determines whether detected currents $I_1$ of the first current path continuously correspond to the characteristic phase failure current. The phase failure current is preferably monitored using a plurality of currents of the first current path determined within a time interval (for example a power supply network current period). Preferably an effective value is formed from the currents $I_1$ of the first current path detected within the time interval and compared with the characteristic phase failure current.

If the result of the determination of the processing unit is that the detected currents $I_1$ of the first current path continuously correspond to the characteristic phase failure current, a phase failure is present relative to the phase conducted via the first current path. The processing unit preferably emits a warning signal, in particular to the master controller, and/or prevents the power supply to the consumer connected downstream.

In a further advantageous embodiment of the invention, the processing unit is configured such that, in three-phase operation of the switchgear, for determining a phase failure of the phase which is conducted via the third current path, it determines whether detected currents $I_3$ of the third current path continuously correspond to the characteristic phase failure current. The phase failure current is preferably monitored using a plurality of currents $I_3$ of the third current path determined within a time interval (for example a power supply network current period). Preferably, an effective value is formed from the currents $I_3$ of the third current path detected within the time interval and compared with the characteristic phase failure current.

If the result of the determination of the processing unit is that the detected currents $I_3$ of the third current path continuously correspond to the characteristic phase failure current, a phase failure is present relative to the phase conducted via the third current path. The processing unit preferably emits a warning signal, in particular to the master controller, and/or prevents the power supply to the consumer connected downstream.

When determining a phase failure relative to the phases conducted via the first and third current paths, preferably the currents $I_1$, $I_3$ which are simultaneously detected within a time interval for determining a phase failure relative to the phase conducted via the second current path are evaluated.

In a further advantageous embodiment of the invention, the processing unit is configured such that, in single-phase operation of the switchgear, for determining a phase failure it determines whether detected currents $I_1$ of the first current path and/or detected currents $I_3$ of the third current path continuously correspond to the characteristic phase failure current.

The phase failure current is preferably monitored using a plurality of currents $I_1$ and/or $I_3$ determined within a time interval (for example a power supply network current period). Preferably, an effective value is formed from the currents $I_1$, $I_3$ of the first and/or third current paths detected within the time interval, and compared with the characteristic phase failure current.

If the result of the determination of the processing unit is that the detected currents $I_1$ of the first current path and/or the detected currents $I_3$ of the third current path continuously correspond to the characteristic phase failure current, a phase failure is present. The processing unit preferably emits a warning signal, in particular to the master controller, and/or prevents the power supply to the consumer connected downstream.

In an advantageous embodiment of the invention, the characteristic phase failure current is present when a phase failure threshold value stored in the processing unit is fallen below. The stored phase failure threshold value is, in particular, dependent on the present nominal motor current on the switchgear. The phase failure threshold value is, in particular, a current value which is less than 30% of the nominal motor current set on the switchgear. Preferably, the phase failure threshold value is ca. 25% of the nominal motor current set on the switchgear.

If the phase failure threshold value is continuously fallen below by the determined current $I_1$ of the first current path or by the determined current $I_3$ of the third current path, or fallen below by the calculated value characterizing the current of the second current path, a phase failure is present relative to the phase conducted via the corresponding current path.

The processing unit is, in particular, a micro-controller.

A nominal motor current predetermined in a fixed manner may be set on the switchgear by the manufacturer for a motor to be connected. It is also conceivable that, via an input device of the switchgear the nominal motor current may be set on the switchgear by the customer. As a result, the phase failure threshold value would be formed using the nominal motor current set by the customer.

It is also conceivable that the phase failure threshold value is a current value stored securely in the processing unit independently of the nominal motor current of the switchgear.

In a further advantageous embodiment of the invention, the switchgear comprises at least two switches which are built into different current paths of the switchgear. A switch is preferably integrated in the first current path and a further switch is preferably integrated in the third current path, so that the power supply to the consumer connected downstream may be prevented thereby via the current path thereof. The switches are preferably electromagnetic relays.

In a further advantageous embodiment of the invention, the processing unit is configured such that the phase overload relative to the phase(s) of the power supply network conducted via the switchgear may be determined thereby.

Initially, the present operating state of the switchgear is determined by the processing unit.

If a three-phase operation of the switchgear is present, the current $I_1$, $I_3$ of the first and third current paths is repeatedly determined by the processing unit within a time interval (for example a power supply network current period). Subsequently, the processing unit compares whether the determined currents $I_1$ of the first current path (for example the effective current value) or the determined currents $I_3$ of the third current path (for example the effective current value) are continuously above a phase overload threshold value within the time interval. Moreover, by the processing unit, by way of the simultaneously detected currents $I_1$, $I_3$ of the first and third current paths, a value characterizing the current $I_2$ on the second current path is calculated by the processing unit (for example the effective current value of the second current path) and subsequently compared with the phase overload threshold value.

If a single-phase operation of the switchgear is present, the current $I_1$, $I_3$ of the first and/or third current path is repeatedly determined by the processing unit within a time interval (for example a power supply network current period). Subsequently, the processing unit compares whether the determined currents $I_1$ of the first current path (for example the effective current value) and/or the determined currents $I_3$ of the third current path (for example the effective current value) considered separately or together are continuously above the phase overload threshold value within the time interval.

The phase overload threshold value is, in particular, a current value which exceeds the nominal motor current set on the switchgear by at least 20%. The phase overload threshold value is preferably a maximum of 120% of the nominal motor current set on the switchgear. The phase overload threshold value is preferably stored in the processing unit.

If the phase overload threshold value is continuously exceeded, the processing unit identifies an overload of the phase of the corresponding current path and emits an overload warning signal. By way of the overload warning signal, in particular, the power supply to the consumer connected downstream is prevented and/or a signal is emitted to a master controller.

Figure 2:
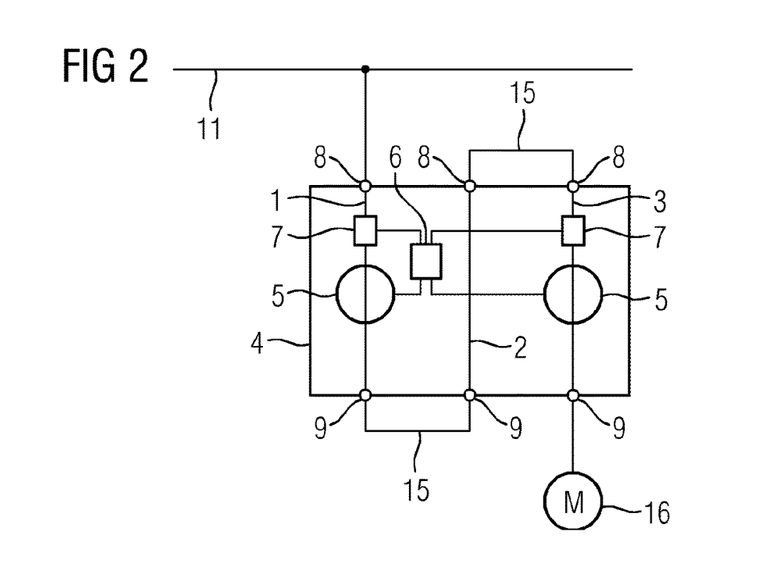
FIG. 2 shows a schematic view of the switchgear of FIG. 1, via which the power supply of a single-phase motor is conducted.

If the present operating state were not determined, in single-phase operation, monitoring the three current paths for overload according to three-phase operation would lead to the current $I_2$ of the second current path according to the connection variant shown in FIG. 2 being double the size of the current $I_1$ of the first current path. Thus an overload would be detected in error. As the present operating mode is initially determined by the processing unit, when determining the phase overload in single-phase operation of the switchgear the current of the second current path is specifically able to be disregarded.

In a further advantageous embodiment of the invention, the processing unit is configured such that a determination of a phase unbalance may be carried out thereby relative to the phase(s) of the power supply network conducted via the switchgear.

The present operating state of the switchgear is initially determined by the processing unit.

If a three-phase operation of the switchgear is present, the processing unit compares whether one of the detected and/or calculated currents $I_1$, $I_2$, $I_3$ continuously deviates from the mean value of the effective values of the detected and calculated currents $I_1$, $I_2$, $I_3$.

A deviation is present, in particular, when the current deviates by ca. 30% from the mean value of the effective values of the detected and/or calculated currents.

If there is a continuous deviation from the mean value, the processing unit identifies a phase unbalance and emits a phase unbalance signal. By way of the phase unbalance signal, in particular, the power supply to the consumer connected downstream is prevented and/or a signal is emitted to a master controller.

During the respective analysis, the respectively determined and/or calculated current of the respective current path may be evaluated. However, the effective value of the current of the respective current path may also be considered. This applies, in particular, to the calculated current $I_2$ of the second current path.

For the respective determination, preferably the currents $I_1$, $I_3$ are repeatedly detected simultaneously within a time interval. Preferably the currents $I_1$, $I_3$ are detected simultaneously at least four times within the time interval, in particular ca. every 500 μs. The simultaneous detection of the currents preferably takes place at regular intervals. The time interval is preferably at least one period, in particular one period, of the current of the power supply network.

For identifying phase failure, phase unbalance and/or overload, the switchgear comprises, in particular, only the two current transformers. Otherwise, no active measurement is carried out on the current paths relative to the identification of phase failure, phase unbalance and/or overload.

A current transformer is a measurement transducer for electrically isolated measurement of high alternating currents.

During the analysis of whether a first value continuously deviates from a second value, an analysis is preferably carried out during a time interval in which the value is repeatedly detected, preferably at least four times and preferably at regular intervals. After detecting the first values within the time interval, in particular, the effective value of the first values relative to the time interval is formed and compared with the second value.

The switchgear serves for controlling and monitoring the power supply of a consumer connected downstream. The switchgear is preferably a motor starter, in particular, for electric motors in the low voltage range.

Instead of the effective value of the respective current $I_1$, $I_2$, $I_3$, a further characteristic value of the respective current $I_1$, $I_2$, $I_3$ may also be formed and/or considered.

Figure 1:
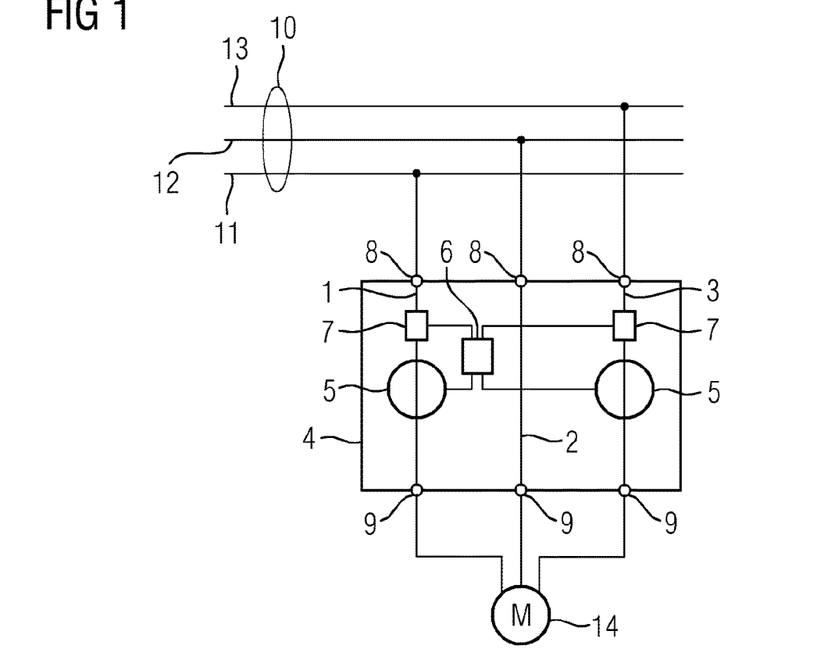
FIG. 1 shows a schematic view of a switchgear, via which the power supply of a three-phase motor is conducted.

FIG. 1 shows a schematic view of a switchgear 4 via which the power supply of a three-phase motor 14 is conducted and FIG. 2 shows a schematic view of the switchgear 4 of FIG. 1, via which the power supply of a single-phase motor 16 is conducted. The switchgear 4 of FIG. 1 and FIG. 2 is the same switchgear 4. The switchgear 4 comprises three input connection points 8, three output connection points 9, a first, second and third current path 1, 2, 3 which are arranged inside the device between the input connection points 8 and the output connection points 9, a first current transformer 5 for measuring the current $I_1$ of the first current path 1, a second current transformer 5 for measuring the current $I_3$ of the third current path 3, and a processing unit 6. The first and third current paths 1, 3 comprise in each case a switch 7, by which an electrically conductive connection between the input connection points 8 and the output connection points 9 may be interrupted, so that the power supply via the respective current path 1, 3 is prevented to the consumer 14, 16 connected downstream. The switch 7 of the first and third current paths 1, 3 is in each case an electromagnetic relay. The second current path 2 does not comprise a current transformer and is configured as a continuous uncontrolled connection between the input and output connection points 8, 9. The switchgear 4 may identify, by its processing unit 6, the present operating mode (single-phase operation or three-phase operation) as well as a phase failure, a phase overload and phase unbalance relative to the power supply conducted via the switchgear 4. The switchgear 4, in particular the processing unit 6 thereof, uses only the two current transformers 5 to this end.

If the switchgear 4 receives the command to start the consumer 14, 16 connected downstream thereto, the processing unit 6 activates the switches 7 such that the power supply is produced for the consumer 14, 16 connected downstream. In particular, an electrically conductive connection is produced between the input and output connection points 8, 9 relative to the first and third current paths 1, 3. The switchgear 4 is able to determine independently therefrom whether it is operated in single-phase operation or three-phase operation. To this end, the processing unit 6 performs the following steps:

Within a time interval, in this case within a period of the current of the power supply network, the current values $I_1$, $I_3$ of the first and third current paths 1, 3 are repeatedly detected simultaneously, in this case every 500 μs.

Relative to the current values $I_1$, $I_3$ of the first and third current paths 1, 3 detected simultaneously within the time interval, the processing unit 6 determines the number (first number) of positive current values $I_1$ of the first current path 1 (also the number of positive current values $I_3$ of the third current path 3 could be determined) as well as the number (second number) of simultaneously positive current values $I_1$, $I_3$ of the first and third current paths 1, 3.

Subsequently, the processing unit 6 monitors whether the first number is greater than at least 1. As a result, the processing unit 6 identifies whether power is supplied via the switchgear 4.

If the result of the monitoring is that within the considered time interval the first number is not greater than at least 1, at this time no power is supplied via the switchgear 4. A phase failure could be present. The switchgear 4 would emit a corresponding error message to a master controller.

If the result of the monitoring is that within the considered time interval the first number is greater than at least 1, the processing unit also monitors whether the second number is greater than 66% of the first number.

If the result of the monitoring by the processing unit 6 is that, within the considered time interval, the first number is greater than at least 1 and the second number is greater than 66% of the first number, the processing unit 6 ascertains a single-phase operation. In other words, power is supplied to a single-phase motor 16 via the switchgear 4; see FIG. 2. If single-phase operation is identified, only the current $I_1$, $I_3$ of the first and/or third current path 1, 3 is analyzed relative to the determination of a phase failure and a phase overload. Moreover, no monitoring of the phase unbalance is carried out.

If the result of the monitoring is that, within the considered time interval, the first number is greater than at least 1 and the second number is less than 66% of the first number, the processing unit 6 ascertains a three-phase operation. In other words, power is supplied to a three-phase motor 14 via the switchgear 4; see FIG. 1. If three-phase operation is identified, the current $I_1$, $I_2$, $I_3$ of the first, second and third current paths 1, 2, 3 is analyzed relative to the determination of a phase failure, a phase overload and a phase unbalance.

The switchgear 4 is thus able to identify independently in which operating mode it is operated.

As power is supplied to a consumer 14, 16 connected downstream via the switchgear 4, the switchgear 4 has a nominal motor current relative to the electric motor 14, 16 to be connected.

In FIG. 1 the switchgear 4 is connected within an industrial installation with its three input connection points 8 to the three phases 11, 12, 13 of a low voltage network 10, in this case a three-phase alternating current network. A three-phase motor 14 is connected to the output connection points 9 of the switchgear 4. The first phase 11 of the low voltage network 10 is conducted via the first current path 1 to the three-phase motor 14. The current I1 of the first phase 11 may be measured and provided to the processing unit 6 by way of the first current transformer 5. The electrically conductive connection between the input and output connection points 8, 9 of the first current path 1 may be interrupted by the switch 7 of the first current path 1. The third phase 13 of the low voltage network 10 is conducted via the third current path 3 to the three-phase motor 14. The current of the third phase 13 may be measured and provided to the processing unit 6 by way of the second current transformer 5. The electrically conductive connection between the input and output connection points 8, 9 of the third current path 3 may be interrupted by the switch 7 of the third current path 3.

The processing unit 6 may simultaneously detect the current $I_1$, $I_3$ of the first and third current paths 1, 3 via the current transformers 5 and calculate therefrom the current $I_2$ of the second current path 2 according to $I_2=0-I_1-I_3$. By repeated simultaneous detection of the current $I_1$, $I_3$ of the first and third current paths, the processing unit may calculate the current $I_2$ of the second current path 2.

After the switchgear 4 has ascertained the three-phase operation, an analysis may be carried out of a phase failure, a phase overload and a phase unbalance relative to the three phases 11, 12, 13 conducted via the three current paths 1, 2, 3.

For determining a phase failure of the phase 12 of the supply network 10 conducted via the second current path 2, the current $I_1$, $I_3$ of the first and third current paths 1, 3 is repeatedly detected simultaneously, initially within a time interval.

A value characterizing the current $I_2$ on the second current path 2 is calculated by way of the currents $I_1$, $I_3$ of the first and third current paths 1, 3 detected simultaneously. In this exemplary embodiment, the current $I_2$ of the second current path 2 is calculated relative to the time interval using the simultaneously detected currents $I_1$, $I_3$ of the first and third current paths 1, 3.

Subsequently, via the processing unit 6 it is determined whether the calculated effective value of the current $I_2$ of the second current path 2 is below 20% of the nominal motor current set on the switchgear 4. The characteristic phase failure current is thus a current which is less than 20% of the nominal motor current set on the switchgear 4.

If the calculated current $I_2$ of the second current path 2 is below 20% of the nominal motor current set on the switchgear 4, a phase failure is present relative to the second phase 12. If the calculated current $I_2$ of the second current path 2 is above 20% of the nominal motor current set on the switchgear 4, there is no phase failure relative to the second phase 12.

In a phase failure of the second phase 12, a phase shift between the first and third phases 11, 13 of 180° is present. As $I_1$ is phase-shifted relative to $I_3$ by 180°, the following applies: $I_3=(-I_1)$. This results in the following: $I_2, =0-I_1-(-I_1)=0$. The value of $I_2$ is thus below 20% of the set nominal motor current. With no phase failure, the current $I_1$ of the first current path 1 is phase-shifted 120° relative to the current $I_3$ of the third current path 3. As a result, the value of $I_2$ is above 20% of the set nominal motor current.

For determining a phase failure of the phase 11 of the supply network 10 conducted via the first current path 1, the current $I_1$ of the first current path 1 repeatedly detected within the time interval is evaluated. In this case, a value of the current $I_1$ of the first current path 1 relative to the time interval is formed by the processing unit 6 and is compared with the characteristic phase failure current. If the calculated value of the current $I_1$ of the first current path 1 is below 20% of the nominal motor current set on the switchgear 4, a phase failure relative to the first phase 11 is present. If the calculated value of the current $I_1$ of the first current path 1 is above 20% of the nominal motor current set on the switchgear 4, no phase failure is present relative to the first phase 11.

For determining a phase failure of the phase 13 of the supply network 10 conducted via the third current path 3, the current $I_3$ of the third current path 3 repeatedly detected within the time interval is evaluated. In this case, a value of the current $I_3$ of the third current path 3 relative to the time interval is formed by the processing unit 6 and is compared with the characteristic phase failure current. If the calculated value of the current $I_3$ of the third current path 3 is below 20% of the nominal motor current set on the switchgear 4, a phase failure relative to the third phase 13 is present. If the calculated value of the current $I_3$ of the third current path 3 is above 20% of the nominal motor current set on the switchgear 4, no phase failure is present relative to the third phase 13.

For determining a phase overload in the three-phase operation of the switchgear 4, the processing unit 6 monitors whether the value of the current $I_1$ of the first current path 1, the value of the current $I_3$ of the third current path 3 or the value of the current $I_2$ of the second current path 2 calculated from the currents $I_1$, $I_3$ of the first and third current paths 1, 3 detected simultaneously, is above a phase overload threshold value. The phase overload threshold value is 120% of the set nominal motor current. If one of the values of the currents $I_1$, $I_2$, $I_3$ is above 120% of the set nominal motor current, a phase overload is present on the corresponding phase.

For determining a phase unbalance in three-phase operation of the switchgear 4, the processing unit 6 monitors whether the individual values of the currents $I_1$, $I_2$, $I_3$ deviate from the mean value of the effective values of the detected and calculated currents $I_1$, $I_2$, $I_3$ relative to the considered time interval. A deviation is present when the considered current deviates by 30% from the mean value of the detected and calculated currents $I_1$, $I_2$, $I_3$.

As may be derived from FIG. 2, the switchgear 4 may also be used for controlling and monitoring the power supply of a single-phase motor 16 connected downstream. To this end, a phase 11 of the low voltage network is connected to the input connection point 8 of the first current path 1. The output connection point 9 of the first current path 1 is connected to the output connection point 9 of the second current path 2 by way of a connection plug 15. The input connection point 8 of the second current path 2 is connected to the input connection point 8 of the third current path 5 by way of a further connecting plug 15. The output connection point 9 of the third current path 3 is connected to the single-phase motor 16.

After the switchgear 4 has ascertained the single-phase operation, an analysis may be carried out of a phase failure and a phase overload relative to the phase 11 conducted via the three current paths 1, 2, 3. In this case, a phase failure and a phase overload are determined in a manner which is approximately analagous to the analysis in three-phase operation. In single-phase operation only the analysis based on the calculated current $I_2$ of the second current path 2 is not carried out.

For determining a phase failure, a current $I_1$ of the first current path 1 repeatedly detected within a time interval is evaluated. In this case, a value of the current $I_1$ of the first current path 1 during the time interval is formed by the processing unit 6 and compared with the characteristic phase failure current. If the calculated value of the current $I_1$ of the first current path 1 is below 20% of the nominal motor current set on the switchgear 4, a phase failure is present relative to the first phase 11. If the calculated value of the current $I_1$ of the first current path 1 is above 20% of the nominal motor current set on the switchgear 4, no phase failure is present relative to the first phase 11.

For determining a phase failure, a current $I_3$ of the third current path 3 repeatedly detected within the time interval is also evaluated. In this case, a value of the current $I_3$ of the third current path 3 during the time interval is formed by the processing unit 6 and compared with the characteristic phase failure current. If the calculated value of the current $I_3$ of the third current path 3 is below 20% of the nominal motor current set on the switchgear 4, a phase failure is present relative to the first phase 11. If the calculated value of the current $I_3$ of the third current path 3 is above 20% of the nominal motor current set on the switchgear 4, no phase failure is present relative to the first phase 11.

For determining a phase overload, in single-phase operation of the switchgear 4, the processing unit 6 monitors whether the value of the current $I_1$ of the first current path 1 or the value of the current $I_3$ of the third current path 3 is above the phase overload threshold value.

Insufficient voltage and/or insufficient load in the switchgear 4 may be identified merely by two current transformers 5 and without voltage measurement in all operating modes. To this end, in three-phase operation, the calculation of insufficient current is necessary in order to be able to identify phase failure additionally in this phase. This is calculated from $I_2=0-I_1-I_3$. For identifying phase failure, the three determined/calculated effective current values are tested for minimum current (in this case 20% of the set nominal motor current). If one or more current values permanently lies below this threshold, a warning signal is emitted to the master controller (for example phase failure in phase x).

When identifying unbalance or overload for motor protection, in single-phase operation of the switchgear 4, exclusive analysis of the current $I_2$ of the second current path 2 would lead to the switchgear always triggering an error message (unbalance warning signal and/or overload warning signal), as the calculated current $I_2$ of the second current path 2 is either zero or double the size of the current $I_1$, $I_3$ on the first and second current transformers 5 ($I_2=2*I_1$ and/or $I_2=2*I_3$). By determining the present operating mode on the switchgear 4, such a faulty evaluation may be avoided.

For identifying phase failure in single-phase operation, the calculated current $I_2$ of the second current path is no longer relevant so that this current is not considered for identifying phase failure, after it has been ascertained that a single-phase operation is present on the switchgear 4. If in single-phase operation the current $I_1$ or $I_3$ (which are identical in this case) falls below the phase failure threshold value, the switchgear 4 triggers a corresponding error message. Thus a phase failure may also be identified in single-phase operation.

In this manner, a cost-effective switchgear 4 may be provided which permits extensive network error identification in three-phase operation and single-phase operation, by using only two current transformers 5 and the processing unit 6 required for evaluating the signals thereof. By the described arrangement of the current transformers 5 in the switchgear 4, and the described manner of evaluation of the signals thereof, all possible failures of individual phases, a plurality of phases or all phases 11, 12, 13 during operation of the switchgear 4 may be identified in three-phase and single-phase applications.

The invention claimed is:

1. A switchgear for a single-phase motor and a three-phase motor, the switchgear comprising:
    a processing unit; and
    a first, second and third current path, the first and third current paths each comprising a current transformer, the processing unit being configured to
    detect, via the current transformers, the current $I_1$ of the first current path and the current $I_3$ of the third current path,
    detect the currents $I_1$, $I_3$ of the first and third current paths and to ascertain a present operating mode of the switchgear via a phase shift between the detected currents $I_1$, $I_3$ of the first and third current paths,
    repeatedly detect, simultaneously, the currents $I_1$, $I_3$ of the first and third current paths within a time interval for ascertaining the present operating mode of the switchgear and either
    determine the first number of positively detected currents $I_1$, $I_3$ of the first or third current paths and the second number of simultaneously positively detected currents $I_1$, $I_3$ of the first and third current paths or
    determine the first number of negatively detected currents $I_1$, $I_3$ of the first or third current paths and the second number of simultaneously negatively detected currents $I_1$, $I_3$ of the first and third current paths and
    subsequently monitor whether the second number is greater than substantially 66% of the first number.

2. The switchgear of claim 1, wherein the processing unit is configured to
    detect the currents $I_1$, $I_3$ of the first and third current paths within a time interval for ascertaining the present operating mode of the switchgear, via the current transformers,
    determine values which characterize the phase shift between the detected currents $I_1$, $I_3$ of the first and third current paths using the detected currents $I_1$, $I_3$ of the first and third current paths, and evaluate the determined characterizing values, and wherein using the evaluation, the present operating mode of the switchgear is ascertained.

3. The switchgear of claim 2, wherein only the first and third current paths comprise a current transformer.

4. The switchgear of claim 2, wherein the processing unit is configured to
calculate, in three-phase operation of the switchgear, calculate a value characterizing the current $I_2$ of the second current path for determining a phase failure of the phase which is conducted via the second current path, via simultaneously detected currents $I_1$, $I_3$ of the first and third current paths, and
determine whether the calculated value corresponds to a characteristic phase failure current.

5. The switchgear of claim 2, wherein the processing unit is configured to, for determining a phase overload within a time interval in three-phase operation of the switchgear, at least one of
compare whether detected currents $I_1$, $I_3$ of the first or third current paths are continuously above a phase overload threshold value and whether a value calculated from the currents $I_1$, $I_3$ of the first and third current paths, characterizing the current $I_2$ on the second current path, is continuously above the phase overload threshold value, and
compare, in single-phase operation of the switchgear, whether detected currents $I_1$, $I_3$ of at least one of the first and third current path is continuously above the phase overload threshold value.

6. The switchgear of claim 2, wherein the processing unit is configured, for determining a phase unbalance in three-phase operation,
compare whether one of the detected and calculated currents $I_1$, and $I_3$ of the first and third current paths continuously deviates from the mean value of the effective values of the at least one of detected and calculated currents $I_1$ and $I_3$.

7. The switchgear of claim 1, wherein only the first and third current paths comprise a current transformer.

8. The switchgear of claim 7, wherein the processing unit is configured to
calculate, in three-phase operation of the switchgear, calculate a value characterizing the current $I_2$ of the second current path for determining a phase failure of the phase which is conducted via the second current path, via simultaneously detected currents $I_1$, $I_3$ of the first and third current paths, and
determine whether the calculated value corresponds to a characteristic phase failure current.

9. The switchgear of claim 1, wherein the processing unit is configured to
calculate, in three-phase operation of the switchgear, calculate a value characterizing the current $I_2$ of the second current path for determining a phase failure of the phase which is conducted via the second current path, via simultaneously detected currents $I_1$, $I_3$ of the first and third current paths, and
determine whether the calculated value corresponds to a characteristic phase failure current.

10. The switchgear of claim 9, wherein the processing unit is configured, for determining a phase unbalance
in three-phase operation, compare whether one of the detected and calculated currents $I_1$, $I_2$, $I_3$ of the first, second and third current paths continuously deviates from the mean value of the effective values of the at least one of detected and calculated currents $I_1$, $I_2$, $I_3$.

11. The switchgear of claim 1, wherein the processing unit is configured to, for determining a phase overload within a time interval in three-phase operation of the switchgear, at least one of
compare whether detected currents $I_1$, $I_3$ of the first or third current paths are continuously above a phase overload threshold value and whether a value calculated from the currents $I_1$, $I_3$ of the first and third current paths, characterizing the current $I_2$ on the second current path, is continuously above the phase overload threshold value, and
compare, in single-phase operation of the switchgear, whether detected currents $I_1$, $I_3$ of at least one of the first and third current path is continuously above the phase overload threshold value.

12. The switchgear of claim 11, wherein the processing unit is configured, for determining a phase unbalance in three-phase operation,
compare whether one of the detected and calculated currents $I_1$, $I_2$, $I_3$ of the first, second and third current paths continuously deviates from the mean value of the effective values of the at least one of detected and calculated currents $I_1$, $I_2$, $I_3$.

13. A method for ascertaining a present operating mode of a switchgear for a single-phase motor and a three-phase motor, the switchgear including a processing unit and a first, second and third current path, wherein the first and third current paths each include a current transformer, the processing unit being configured to detect, via the current transformers, the current $I_1$ of the first current path and the current $I_3$ of the third current path, wherein for ascertaining a present operating mode of the switchgear, the processing unit performs at least:
repeatedly detecting simultaneously the currents $I_1$, $I_3$ of the first and third current paths within a time interval;
determining a first number of positively detected currents $I_1$, $I_3$ of the first or third current path within the time interval;
determining a second number of simultaneously positively detected currents $I_1$, $I_3$ of the first and third current paths within the time interval, or
determining the first number of negatively detected currents $I_1$, $I_3$ of the first or third current path within the time interval and determining the second number of simultaneously negatively detected currents $I_1$, $I_3$ of the first and third current paths within the time interval; and
monitoring whether the determined second number is greater than substantially 66% of the determined first number.

14. The method of claim 13, wherein, in three-phase operation of the switchgear for determining a phase failure of the phase conducted via the second current path, the processing unit performs at least:
repeatedly detecting simultaneously the current $I_1$, $I_3$ of the first and third current paths,
calculating a value characterizing the current $I_2$ on the second current path by the simultaneously detected currents $I_1$, $I_3$ of the first and third current paths, and
determining whether the calculated value corresponds to a characteristic phase failure current.

15. The method of claim 14, wherein, in three-phase operation of the switchgear for determining a phase failure of the phase conducted via the first current path, the processing unit performs at least:
repeatedly detecting the current $I_1$ of the first current path, and determining whether the detected currents $I_1$ of the first current path continuously correspond to the characteristic phase failure current.

16. The method of claim 14, wherein, in three-phase operation of the switchgear for determining a phase failure of the phase conducted via the first current path, the processing unit performs at least:
repeatedly detecting the current $I_1$ of the first current path, and
determining whether the detected currents $I_1$ of the first current path continuously correspond to the characteristic phase failure current.

17. The method of claim 14, wherein, in single-phase operation of the switchgear for determining a phase failure, the processing unit performs at least:
at least one of repeatedly detecting the current $I_1$ of the first current path and repeatedly detecting the current $I_3$ of the third current path, and
determining whether at least one of the detected currents of the first current path $I_1$ and the detected currents $I_3$ of the third current path continuously correspond to the characteristic phase failure current.

18. The method of claim 14, wherein, in three-phase operation of the switchgear for determining a phase overload, the processing unit performs at least:
repeatedly detecting simultaneously the currents $I_1$, $I_3$ of the first and third current paths,
calculating a value characterizing the current $I_2$ on the second current path by the simultaneously detected currents $I_1$, $I_3$ of the first and third current paths,
determining whether the detected currents $I_1$, $I_3$ of the first or third current path are continuously above a phase overload threshold, and
determining whether the calculated value characterizing the current $I_2$ on the second current path is above the phase overload threshold value.

19. The method of claim 14, wherein for determining a phase unbalance, the processing unit:
in three-phase operation, compares whether one of the currents $I_1$, $I_2$, $I_3$ of the first, second and third current paths continuously deviates from the mean value of the effective values of the detected and calculated currents $I_1$, $I_2$, $I_3$.

20. The method of claim 13, wherein, in three-phase operation of the switchgear for determining a phase failure of the phase conducted via the third current path, the processing unit performs at least:
repeatedly detecting the current $I_3$ of the third current path, and
determining whether the detected currents $I_3$ of the third current path continuously correspond to the characteristic phase failure current.

21. The method of claim 13, wherein, in single-phase operation of the switchgear for determining a phase failure, the processing unit performs at least:
at least one of repeatedly detecting the current $I_1$ of the first current path and repeatedly detecting the current $I_3$ of the third current path, and
determining whether at least one of the detected currents of the first current path $I_1$ and the detected currents $I_3$ of the third current path continuously correspond to the characteristic phase failure current.

22. The method of claim 13, wherein, in three-phase operation of the switchgear for determining a phase overload, the processing unit performs at least:
repeatedly detecting simultaneously the currents $I_1$, $I_3$ of the first and third current paths,
calculating a value characterizing the current $I_2$ on the second current path by the simultaneously detected currents $I_1$, $I_3$ of the first and third current paths,
determining whether the detected currents $I_1$, $I_3$ of the first or third current path are continuously above a phase overload threshold, and
determining whether the calculated value characterizing the current $I_2$ on the second current path is above the phase overload threshold value.

23. The method of claim 22, wherein, in single-phase operation of the switchgear for determining a phase overload, the processing unit performs at least:
repeatedly detecting the currents $I_1$, $I_3$ of at least one of the first and third current paths, and
determining whether the detected currents $I_1$, $I_3$ of the at least one of the first and third current path are continuously above the phase overload threshold value.

24. The method of claim 13, wherein for determining a phase unbalance, the processing unit:
in three-phase operation, compares whether one of the currents $I_1$, $I_2$, $I_3$ of the first, second and third current paths continuously deviates from the mean value of the effective values of the detected and calculated currents $I_1$, $I_2$, $I_3$.

25. The method of claim 13, wherein, in single-phase operation of the switchgear for determining a phase overload, the processing unit performs at least:
repeatedly detecting the currents $I_1$, $I_3$ of at least one of the first and third current paths, and
determining whether the detected currents $I_1$, $I_3$ of the at least one of the first and third current path are continuously above the phase overload threshold value.

* * * * *